United States Patent
Luo et al.

(10) Patent No.: US 9,572,262 B2
(45) Date of Patent: Feb. 14, 2017

(54) PRINTED CIRCUIT BOARD BACKUP PLATE AND THE PREPARATION METHOD THEREOF

(71) Applicant: SHENZHEN NEWCCESS INDUSTRIAL CO.,LTD, Shenzhen (CN)

(72) Inventors: Xiaoyang Luo, Shenzhen (CN); Liu Yang, Shenzhen (CN); Jialin Tang, Shenzhen (CN); Xianzhi Qin, Shenzhen (CN)

(73) Assignee: SHENZHEN NEWCCESS INDUSTRIAL CO., LTD, Shenzhen (CN)

( * ) Notice: Subject to any disclaimer, the term of this patent is extended or adjusted under 35 U.S.C. 154(b) by 0 days.

(21) Appl. No.: 14/816,614

(22) Filed: Aug. 3, 2015

(65) Prior Publication Data

US 2016/0057849 A1 Feb. 25, 2016

(30) Foreign Application Priority Data

Aug. 22, 2014 (CN) .......................... 2014 1 0416851

(51) Int. Cl.
*H05K 3/00* (2006.01)
*C10M 111/00* (2006.01)
(Continued)

(52) U.S. Cl.
CPC ............. *H05K 3/0047* (2013.01); *B32B 21/08* (2013.01); *C10M 7/00* (2013.01); *C10M 111/00* (2013.01);
(Continued)

(58) Field of Classification Search
CPC ...... H05K 3/0047; H05K 3/0044; H05K 3/00; H05K 3/0011; H05K 2203/0214; B32B 21/08;B32B 37/15; B32B 27/18; B32B 21/02; C10M 7/00; C10M 107/00; C10M 107/34; C10M 2209/00; C10M 2209/003; C10M 2209/006; C10M 2209/062; C10M 2209/0625; C10M 2209/103; C10M 2209/1033; C10M 2209/1036; C10M 2209/107; C10M 2209/1075; C10M 123/00; C10M 123/02; C10M 123/04; C10M 123/06; C10M 111/00; C10M 111/02; C10M 111/04; C10M 111/06
(Continued)

(56) References Cited

U.S. PATENT DOCUMENTS 4,781,495 A * 11/1988 Hatch .................. H05K 3/0047 264/155
6,992,156 B2 * 1/2006 Parker ....................... C08F 2/22 526/204

(Continued)

FOREIGN PATENT DOCUMENTS

CN 202336607 U 7/2012
CN 202984737 * 6/2013
(Continued)

OTHER PUBLICATIONS

Somasundara, et al., "Silicone Emulsions", Advances in Colloid and Interface Science, 128-130, 2006, p. 103-109.*
(Continued)

*Primary Examiner* — Philip Tucker
*Assistant Examiner* — Jimmy R Smith, Jr.
(74) *Attorney, Agent, or Firm* — Anova Law Group, PLLC

(57) ABSTRACT

A PCB backup plate preparation method comprises: lubricating and radiating resin is coated onto both surfaces of the wood fiberboard and a resin layer forms, before it is totally (Continued)

dried out, wood pulp paper is bonded to its surfaces, then, the surface of the wood pulp paper is coated with unsaturated polyester resin and forms a resin layer, and the PCB backup plate is prepared; the lubricating and radiating resin is prepared by a 95 weight portion of principal component, composed by two or more of polyethylene oxide, polyethylene glycol, glycerol, vinyl acetate and polyvinyl alcohol, and a 5 portion of nonionic surfactant. The lubricating and radiating resin brings the PCB good lubricating and radiating capabilities, therefore increases the drilling hole accuracy when starts to drill, improves the hole wall quality and lowers the drill pin temperature.

10 Claims, 1 Drawing Sheet

(51) Int. Cl.
  *C10M 107/00*  (2006.01)
  *B32B 21/08*  (2006.01)
  *B32B 21/02*  (2006.01)
  *B32B 27/18*  (2006.01)
  *B32B 37/15*  (2006.01)

(52) U.S. Cl.
  CPC ............... *B32B 21/02* (2013.01); *B32B 27/18* (2013.01); *B32B 37/15* (2013.01); *C10M 2209/00* (2013.01); *H05K 2203/0214* (2013.01)

(58) Field of Classification Search
  USPC .................. 428/292.1, 292.4, 292.7, 481
  See application file for complete search history.

(56) References Cited

U.S. PATENT DOCUMENTS

2003/0100456 A1* 5/2003 Hasaki ................. B23B 35/005
                        508/517
2004/0209091 A1* 10/2004 Izumi .................... C08L 101/00
                        428/461
2006/0160986 A1* 7/2006 Hazen .................... C08G 63/20
                        528/272

FOREIGN PATENT DOCUMENTS

| CN | 202984737 U | | 6/2013 |
| CN | 103937387 A | * | 7/2014 |
| JP | 01114425 A | * | 5/1989 |
| WO | 2009151107 A1 | | 12/2009 |

OTHER PUBLICATIONS

Machine translation of CN 103937387.*
Machine translation of CN 202984737.*
English abstract of JP 01114425.*

* cited by examiner

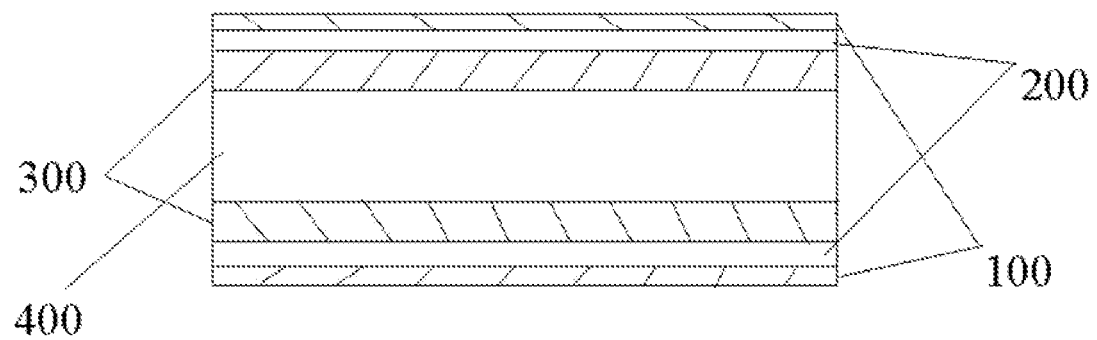

PRINTED CIRCUIT BOARD BACKUP PLATE AND THE PREPARATION METHOD THEREOF

CROSS-REFERENCES TO RELATED APPLICATIONS

This application claims the priority of Chinese patent application no 2014104168514, filed on Aug. 22, 2014, the entire contents of all of which are incorporated herein by reference.

FIELD OF THE INVENTION

The present invention relates to the field of technologies on printed circuit board (PCB) preparation, and more particularly, to a printed circuit board (PCB) backup plate and the preparation method thereof.

BACKGROUND

In the production process of PCB, in order to be able to interconnect the upper and lower levels, drill pin is needed to penetrate the insulating layer in a small area before electroplating the conductive layer. During the drilling process, in order to improve the drilling accuracy and reduce the drilling burrs, an aluminum cover plate is placed over the copper clad laminate (CCL) to be drilled and a back up board is placed under the CCL, in order to help in heat transfers, guidance and protections to the drilling pin. In the present technologies, the lubricating and radiating resin is mainly applied to the cover plate; however, after the drill passes through the cover plate and the PCB plate, the lubrication and radiation capacities of the resin have been almost totally consumed. After the drilling process, the PCB generates relatively large heat and which is easy to make the copper surfaces red and even get separated. Therefore, the prior art needs to be improved and developed.

BRIEF SUMMARY OF THE DISCLOSURE

The technical problem to be solved in the present invention, aiming at the defects of the prior art, provides a printed circuit board backup plate and the preparation method thereof, in order to solve the problems in the prior art, that is, the lubrication and radiation capacities of the backup plate are insufficient.

The technical solution of the present invention to solve the technical problems is as follows:

A preparation method for PCB backup plate, wherein, the preparation method includes: Lubricating and radiating resin is coated respectively on the upper and lower surfaces of the wood fiberboard to form a lubricating and radiating resin layer, and before the lubricating and radiating resin is completely dried out, wood pulp paper is bonded to the surfaces of the lubricating and radiating resin layer, then, the surface of the wood pulp paper is coated with unsaturated polyester resin and an unsaturated polyester resin layer forms, finally the PCB backup plate is prepared; wherein, the lubricating and radiating resin is prepared by a principal component of which the weight portion is 95 and a nonionic surfactant of which the weight portion is 5, the principal component is composed by two or more of polyethylene oxide, polyethylene glycol, glycerol, vinyl acetate and polyvinyl alcohol.

The preparation method for the PCB backup plate, wherein, the nonionic surfactant is an organosilicone surfactant.

The preparation method for the PCB backup plate, wherein, the principal components, counted in weight portions, are: polyethylene oxide 10-30, polyethylene glycol 10-30, glycerol 3-8, vinyl acetate 30-60.

The preparation method for the PCB backup plate, wherein, the principal components, counted in weight portions, are: polyethylene oxide 10-25, polyethylene glycol 10-25, glycerol 2-6, polyvinyl alcohol 40-60.

The preparation method for the PCB backup plate, wherein, the unsaturated polyester is also added with an auxiliary agent and the auxiliary agent comprises one or more of the initiator, the promoter and the inhibitor.

The preparation method for the printed circuit board backup plate, wherein, the initiator is cyclohexanone peroxide or dicμmyl peroxide; the accelerator is cobalt naphthenate; the inhibitor is one or more of the hydroquinone and styrene.

The preparation method for the PCB backup plate, wherein, the unsaturated polyester is synthesized by maleic anhydride, phthalic anhydride and propylene glycol.

The preparation method for the PCB backup plate, wherein, the surface hardness of the unsaturated polyester resin layer is not less than 85 shore-D.

The preparation method for the PCB backup plate, wherein, the thickness of the wood fiberboard is 1.5-2.5 mm; and the thickness of the lubricating and radiating resin layer is 30-150 μm; the thickness of the wood pulp paper is 10-50 μm, and the thickness of the unsaturated polyester resin layer is 5-30 μm.

A printed circuit board backup plate, wherein, the printed circuit board backup plate is prepared by anyone of the method described above.

Benefits: The invention provides a PCB backup plate and the preparation method thereof, that is, adding lubricating and radiating resin into the backup plate bringing the backup plate very good lubricating and radiating capabilities, thereby increasing the drill hole accuracy when the drill pin starts to drill, improving the quality of the hole wall and lowing the drill pin temperature, therefore avoiding the problems of hole wall roughness and copper surface redness, caused by the existing backup plate after drilling the PCB. The present invention owns a good value in the industrial production and application prospects.

BRIEF DESCRIPTION OF THE DRAWINGS

FIG. 1 illustrates a schematic diagram of the PCB backup plate as described in a specific embodiment in the present invention.

DETAILED DESCRIPTION

The invention provides a printed circuit board (PCB) backup plate and the preparation method thereof, in order to make the purpose, technical solution and the advantages of the present invention clearer and more explicit, further detailed descriptions of the present invention are stated here, referencing to the attached drawings and some embodiments of the present invention. It should be understood that the detailed embodiments of the invention described here are used to explain the present invention only, instead of limiting the present invention.

A preparation method for PCB backup plate, wherein, the preparation method includes the following steps:

A. Lubricating and radiating resin is coated respectively on the upper and lower surfaces of the wood fiberboard to form a lubricating and radiating resin layer, and before the lubricating and radiating resin is completely dry, wood pulp paper is bonded to the surfaces of the lubricating and radiating resin layer.
B. The surface of the wood pulp paper is coated with unsaturated polyester resin and forms an unsaturated polyester resin layer, and then the PCB backup plate is prepared.

Wherein, the lubricating and radiating resin is prepared by a principal component whose weight portion is 95 and a nonionic surfactant whose weight portion is 5, the principal component is composed by two or more of polyethylene oxide, polyethylene glycol, glycerol, vinyl acetate and polyvinyl alcohol.

Specifically, the ratio of the principal components, counted in weight portions, could be: polyethylene oxide 10-30, polyethylene glycol 10-30, glycerol 3-8, vinyl acetate 30-60. In another specific embodiment, the ratio of the principal components, counted in weight portions, could be: polyethylene oxide 10-25, polyethylene glycol 10-25, glycerol 2-6, vinyl acetate 40-60.

The lubricating and radiating resin can provide two functions of lubrication and heat radiation. In the process of drilling a PCB, the lubricating and radiating resin starts to melt at about 60° C. and absorbs large amount of heat, which may effectively lower the temperature of the drill pin, thus protect the drill pin and reduce its wear and tear. When the drill pin returns, the lubricating and radiating resin is smoother and more flexible than any normal resin, which will not cause damages to the hole-wall, thus effectively reduce the hole-wall roughness. Also adopting the backup plate owning lubricating and radiating functions, can provide lubricating and radiating functions on both sides of the PCB, and improve the drilling precisions. Due to the accuracy improvement, the number of PCB stacks can be increased, so the drilling efficiency can be greatly improved.

The wood pulp paper is able to assist in the chips-removal, thus further improves the drilling quality. The resin layer is mainly applied to provide sufficient surface hardness to reduce the burrs in the drilling process to PCB. The wood pulp paper layer and the surface resin layer can further improve the usage performance of the PCB backup plate, and better ensures the quality of the PCB drilling holes.

It should be noted that the main function of the resin layer is applied to improve the surface hardness of the backup plate, therefore, it can also be made of other resins with a higher hardness when needed, and the specific process of other resins coating on the wood pulp paper belongs to the prior art, which will not be repeated here.

Specifically, the nonionic surfactant is an organosilicone surfactant.

Using the organicsilicone surfactants may change the microstructures in the wood fiber board surfaces, and make the lubricating and radiating resin coat the wood fiber board surfaces better, thus may enhance the fitting degrees and adhesion strength between them. Of course, other suitable nonionic surfactants may also be applied.

The preparation method for the PCB backup plate, wherein, auxiliary agents are also added to the unsaturated polyester, while the auxiliary agents include one or more of the initiator, the promoter and the inhibitor.

More specifically, the initiator is cyclohexanone peroxide or dicμmyl peroxide; the promoter is cobalt naphthenate; the inhibitor is one or more of the hydroquinone and styrene.

Specifically, the unsaturated polyester is synthesized from maleic anhydride, phthalic anhydride and propylene glycol, whose production process has a mature production technology, belongs to the prior art and will not be repeated here again. It should be noted that the unsaturated polyester resin may also be made from other commonly used raw materials according to other existing techniques.

More preferably, the surface hardness of the unsaturated polyester resin layer is no less than 85 shore-D, while 85 shore-D means it is measured with a shore-D durometer. Specifically, the thickness of the wood fiberboard is 1.5-2.5 mm; the thickness of the lubricating and radiating resin layer is 30-150 μm; the thickness of the wood pulp paper is 10-50 μm, and the thickness of the unsaturated polyester resin layer is 5-30 μm. The thickness of the lubricating and radiating resin layer can provide adequate lubrication and radiation capacity, while the thickness of the wood pulp paper is able to achieve the best effects in chips removal during the PCB drilling process.

Embodiment 1:

Counted in weight portions, mix 95 portions of the principal component of the lubricating and radiating resin and 5 portions of auxiliary agents and an emulsion is formed. The principal component of the lubricating and radiating resin, counted in weight portions, is composed by 10 portions of polyethylene oxide, 10 portions of polyethylene glycol, 3 portions of glycerin and 30 portions of vinyl acetates, while the auxiliary agent is an organosilicone surfactant. The emulsion is sprayed onto the surfaces of the wood fiber board by a coating machine, and before the latex is totally dried out, attach the wood pulp paper onto the lubricating and radiating resin surfaces then dry it out.

Counted in weight portions, taking 100 portions of unsaturated polyesters, 2 portions of initiator and 0.4 portions of promoter, wherein, the unsaturated polyester synthesized by maleic anhydride, phthalic anhydride and propylene glycol. The initiator is cyclohexanone peroxide and the promoter is cobalt naphthenate. The mixture is coated onto the wood pulp paper before naturally drying out, and the PCB backup plate will be prepared.

Embodiment 2

Counted in weight portions, mix 95 portions of the principal component of the lubricating and radiating resin and 5 portions of auxiliary agents and an emulsion is formed. The principal component of the lubricating and radiating resin, counted in weight portions, is composed by 10 portions of polyethylene oxide, 10 portions of polyethylene glycol, 2 portions of glycerin and 40 portions of vinyl acetates, while the auxiliary agent is an organosilicone surfactant. The emulsion is sprayed onto the surfaces of the wood fiber board by a coating machine, and before the latex is totally dried out, attach the wood pulp paper onto the lubricating and radiating resin surfaces then dry it out.

Counted in weight portions, taking 100 portions of unsaturated polyesters, 2 portions of initiator, 0.4 portions of promoter, and 0.5 portions of inhibitor, wherein, the unsaturated polyester is synthesized by maleic anhydride, phthalic anhydride and propylene glycol. The initiator is cyclohexanone peroxide, the promoter is cobalt naphthenate and the inhibitor s hydroquinone or styrene. The mixture is coated onto the wood pulp paper before naturally drying out, and the PCB backup plate will be prepared.

Embodiment 3:

Counted in weight portions, mix 95 portions of the principal component of the lubricating and radiating resin end 5 portions of auxiliary agents and an emulsion is formed. The principal component of the lubricating and radiating resin, counted in weight portions, is composed by 30 portions of polyethylene oxide, 30 portions of polyethylene glycol, 8 portions of glycerin and 60 portions of vinyl acetates, while the auxiliary agent is an organosilicone surfactant. The emulsion is sprayed onto the surfaces of the wood fiber board by a coating machine, and before the latex is totally dried out, attach the wood pulp paper onto the lubricating and radiating resin surfaces then dry it out.

Counted in weight portions, taking 100 portions of unsaturated polyesters, 4 portions of initiator and 2 portions of promoter, wherein the unsaturated polyester is synthesized by maleic anhydride, phthalic anhydride and propylene glycol. The initiator is cyclohexanone peroxide and the promoter is cobalt naphthenate. The mixture is coated onto the wood pulp paper before naturally drying out, and the PCB backup plate will be prepared.

Embodiment 4

Counted in weight portions, mix 95 portions of the principal component of the lubricating and radiating resin and 5 portions of auxiliary agents and an emulsion is formed. The principal component of the lubricating and radiating resin, counted in weight portions, is composed by 25 portions of polyethylene oxide, 25 portions of polyethylene glycol, 6 portions of glycerin and 60 portions of vinyl acetates, while the auxiliary agent is an organosilicone surfactant. The emulsion is sprayed onto the surfaces of the wood fiber board by a coating machine, and before the latex is totally dry out, attach the wood pulp paper onto the lubricating and radiating resin surfaces then dry it out.

Counted in weight portions, taking 100 portions of unsaturated polyesters, 4 portions of initiator, 2 portions of promoter, and 1.5 portions of inhibitor, wherein, the unsaturated polyester is synthesized by maleic anhydride, phthalic anhydride and propylene glycol. The initiator is cyclohexanone peroxide, the promoter is cobalt naphthenate and the inhibitor is hydroquinone or styrene. The mixture is coated onto the wood pulp paper before naturally drying out, and the PCB backup plate will be prepared.

Shown as FIG. 1, the invention also provides a PCB backup plate in a specific embodiment adopting the method, which contains 7 layers from the top down: the resin layer 100, the wood pulp paper layer 200, the lubricating and radiating resin layer 300 and the wood fiber board 400.

The backup plate is centered by the wood fiber board, and the resin layer, the wood pulp paper layer, and the lubricating and radiating layer are all distributed symmetrically. Adding lubricating and radiating resin lays into the backup plate, brings it good lubricating and radiating functions, thus improves the drilling accuracy when the drill pin inserts into the drill hole, also improves the quality of the hole wall and lowers the drill pin temperature, avoids the problems of hole wall roughness and high local temperature in the PCB, caused by the existing backup plate after drilling the PCB.

All above, the invention provides a PCB backup plate and the preparation method thereof, that is, adding lubricating and radiating resin into the backup plate during manufacturing process, bringing the backup plate very good lubricating and radiating capabilities, thereby increasing the drill hole accuracy when the drill pin starts to drill, improving the quality of the hole wall and lowering the drill pin temperature, therefore avoiding the problems of hole wall roughness and copper surface redness, caused by the existing backup plates after drilling the PCB. The present invention owns a good value in the industrial production and application prospects.

It should be understood that, the application of the present invention is not limited to the examples listed. It will be possible for a person skilled in the art to make modification or replacements according to the descriptions, which shall all fall within the scope of protection in the appended claims of the present invention.

What is claimed is:

1. A method for preparing a printed circuit board backing plate, comprising:
    coating a lubricating and radiating resin on the upper and lower surfaces of a wood fiberboard to form a lubricating and radiating resin layer;
    before the lubricating and radiating resin is completely dried out, bonding a wood pulp paper to the exposed surfaces of the lubricating and radiating resin layer; and
    coating the outer surface of the wood pulp paper with unsaturated polyester resin to form an unsaturated polyester resin layer;
    wherein the lubricating and radiating resin is prepared from a principal component of 95 parts by weight and a nonionic surfactant of 5 parts by weight, the principal component is composed of polyethylene oxide, polyethylene glycol, glycerol, and one of vinyl acetate and polyvinyl alcohol.

2. The method of claim 1, wherein the nonionic surfactant is an organosilicon surfactant.

3. A method for preparing a printed circuit board backing plate, comprising:
    coating a lubricating and radiating resin on the upper and lower surfaces of a wood fiberboard to form a lubricating and radiating resin layer;
    before the lubricating and radiating resin is completely dried out, bonding a wood pulp paper to the exposed surfaces of the lubricating and radiating resin layer; and
    coating the outer surface of the wood pulp paper with unsaturated polyester resin to form an unsaturated polyester resin layer;
    wherein the lubricating and radiating resin is prepared from a principal component of 95 parts by weight and a nonionic surfactant of 5 parts by weight, the principal component, in parts by weight, is composed of: polyethylene oxide 10-30, polyethylene glycol 10-30, glycerol 3-8, vinyl acetate 30-60.

4. A method for preparing a printed circuit board backing plate, comprising:
    coating a lubricating and radiating resin on the upper and lower surfaces of a wood fiberboard to form a lubricating and radiating resin layer;
    before the lubricating and radiating resin is completely dried out, bonding a wood pulp paper to the exposed surfaces of the lubricating and radiating resin layer; and
    coating the outer surface of the wood pulp paper with unsaturated polyester resin to form an unsaturated polyester resin layer;
    wherein the lubricating and radiating resin is prepared from a principal component of 95 parts by weight and a nonionic surfactant of 5 parts by weight, the principal component, in parts by weight, is composed of: polyethylene oxide 10-25, polyethylene glycol 10-25, glycerol 2-6, polyvinyl alcohol 40-60.

5. The method of claim 1, wherein the unsaturated polyester is also added with an auxiliary agent comprising one or more of an initiator, a promoter and an inhibitor.

6. The method of claim 5, wherein:
    the initiator is cyclohexanone peroxide or dicumyl peroxide;
    the promoter is cobalt naphthenate; and
    the inhibitor is one or more of hydroquinone and styrene.

7. The method of claim 1, wherein the unsaturated polyester is synthesized from maleic anhydride, phthalic anhydride and propylene glycol.

8. The method of claim 1, wherein the surface hardness of the unsaturated polyester resin layer is not less than 85 shore-D.

9. The preparation method of claim 1, wherein:
the thickness of the wood fiberboard is 1.5-2.5 mm;
the thickness of the lubricating and radiating resin layer is 30-150 μm;
the thickness of the wood pulp paper is 10-50 μm; and the thickness of the unsaturated polyester resin layer is 5-30 μm.

10. A printed circuit board backing plate prepared by the method of claim 1.

* * * * *